(12) United States Patent  
Gui

(10) Patent No.: US 7,388,663 B2
(45) Date of Patent: Jun. 17, 2008

(54) OPTICAL POSITION ASSESSMENT APPARATUS AND METHOD

(75) Inventor: Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 196 days.

(21) Appl. No.: 10/975,183

(22) Filed: Oct. 28, 2004

(65) Prior Publication Data

US 2006/0092419 A1      May 4, 2006

(51) Int. Cl.
    *G01B 11/00* (2006.01)
(52) U.S. Cl. .................. 356/401; 356/399; 356/400
(58) Field of Classification Search .............. 356/401; 355/53
    See application file for complete search history.

(56) References Cited

U.S. PATENT DOCUMENTS

| | | | |
|---|---|---|---|
| 5,040,005 A * | 8/1991 | Davidson et al. ........... 396/429 |
| 5,220,176 A | 6/1993 | Kawai et al. | |
| 5,229,872 A | 7/1993 | Mumola | |
| 5,296,891 A | 3/1994 | Vogt et al. | |
| 5,492,601 A * | 2/1996 | Ostermayer et al. ........ 162/198 |
| 5,496,407 A * | 3/1996 | McAleavey ................. 118/677 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,614,988 A * | 3/1997 | Kato et al. ..................... 355/46 |
| 5,617,211 A * | 4/1997 | Nara et al. ................... 356/401 |
| 5,677,703 A | 10/1997 | Bhuva et al. | |
| 5,805,866 A * | 9/1998 | Magome et al. .............. 716/19 |
| 5,808,797 A | 9/1998 | Bloom et al. | |
| 5,911,161 A * | 6/1999 | Harris .......................... 73/618 |
| 5,923,409 A * | 7/1999 | Hamada et al. ................ 355/72 |
| 5,956,134 A * | 9/1999 | Roy et al. ................ 356/237.5 |
| 5,982,553 A | 11/1999 | Bloom et al. | |

(Continued)

FOREIGN PATENT DOCUMENTS

EP      0 715 214 A1      5/1996

(Continued)

OTHER PUBLICATIONS

Goldschen et al (http://hms.upenn.edu/pelachaud/workshop_face/subsubsection3_7_1_4.html).*

(Continued)

*Primary Examiner*—Gregory J. Toatley, Jr.
*Assistant Examiner*—Jarreas C Underwood
(74) *Attorney, Agent, or Firm*—Sterne, Kessler, Goldstein & Fox P.L.L.C.

(57) ABSTRACT

A lithographic apparatus comprises a substrate table that supports a substrate having alignment marks on a surface thereof. The apparatus further comprises a frame moveable relative to the substrate to provide for a scanning or stepping mode of operation. An array of projection systems is disposed across the frame for projecting respective patterned beams onto a target portion of the substrate. A plurality of alignment mark detectors are attached to the frame and are moveable with respect to the frame using respective linear drive mechanisms. A position sensor is associated with each alignment mark detector for determining the position of the detector relative to the frame. A control system is responsible for both initial positioning of the detectors above alignment mark patterns on the substrate, and for dynamic alignment of the frame and substrate during a lithographic process.

17 Claims, 6 Drawing Sheets

U.S. PATENT DOCUMENTS

| | | | |
|---|---|---|---|
| 6,133,986 A | 10/2000 | Johnson | |
| 6,177,980 B1 | 1/2001 | Johnson | |
| 6,342,943 B1 | 1/2002 | Nara | |
| 6,355,994 B1* | 3/2002 | Andeen et al. | 310/15 |
| 6,417,914 B1* | 7/2002 | Li | 355/75 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,906,782 B2* | 6/2005 | Nishi | 355/53 |
| 6,950,188 B2* | 9/2005 | Wu et al. | 356/401 |
| 7,164,175 B2* | 1/2007 | Kawasaki et al. | 257/401 |
| 2001/0033996 A1* | 10/2001 | Lin | 430/311 |
| 2002/0018192 A1* | 2/2002 | Nishi | 355/53 |
| 2004/0008332 A1 | 1/2004 | Nakaya et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2006/0027538 A1* | 2/2006 | Ekberg et al. | 219/121.8 |
| 2006/0092419 A1* | 5/2006 | Gui | 356/401 |

FOREIGN PATENT DOCUMENTS

| | | |
|---|---|---|
| EP | 0 756 207 A2 | 1/1997 |
| EP | 07 786 702 A2 | 7/1997 |
| WO | WO 98/33096 | 7/1998 |
| WO | WO 98/38597 | 9/1998 |

OTHER PUBLICATIONS

European Search Report Application No. 05255793.1 mailed by European Patent Office Feb. 16, 2006 8 pages.

* cited by examiner

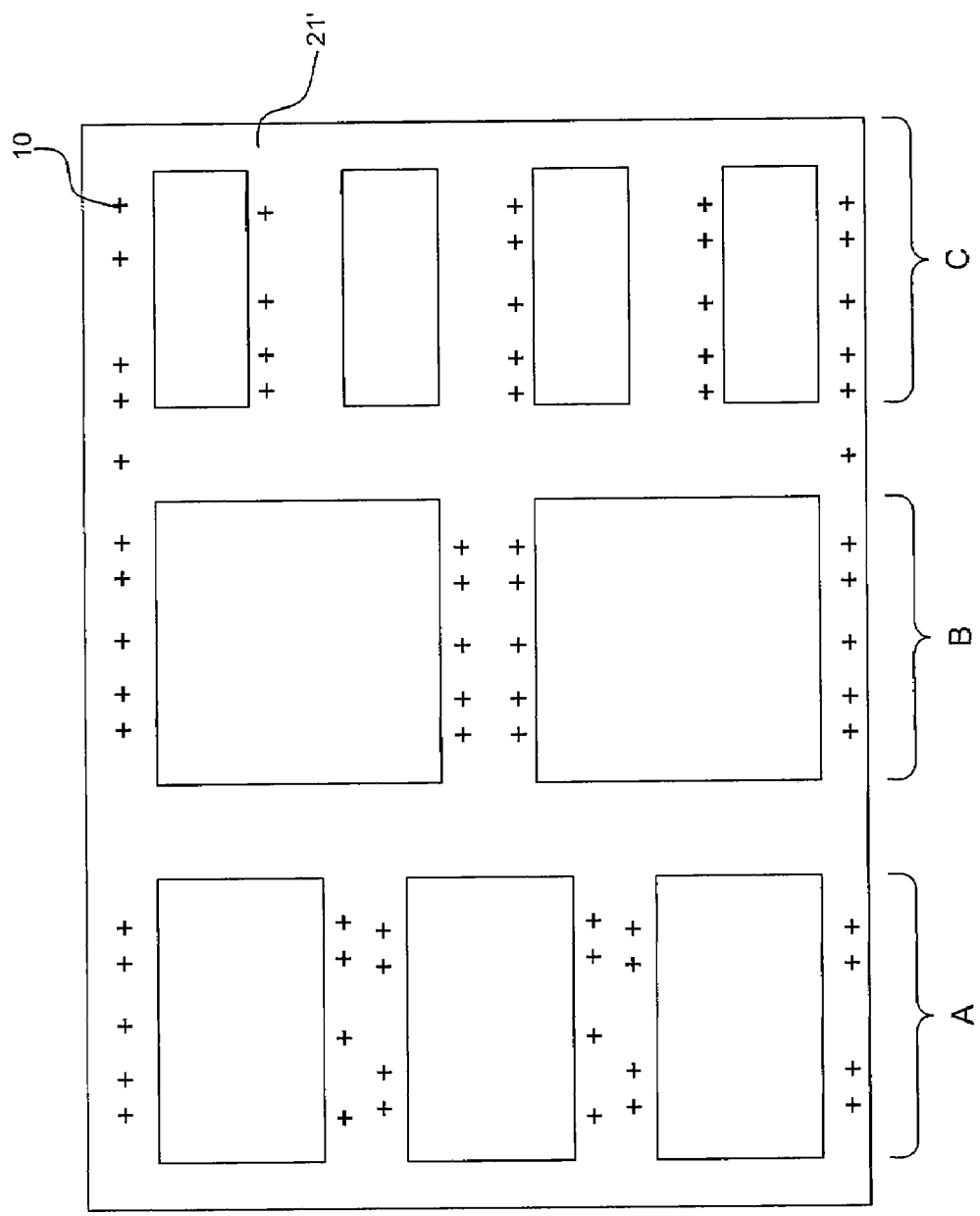

OPTICAL POSITION ASSESSMENT APPARATUS AND METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

It will be appreciated that, whether or not a lithographic apparatus operates in stepping or scanning mode, it is desired that the patterned beam or beams is/are directed onto the appropriate target portion of the substrate surface. In many circumstances, multi-layer structures are built up on the surface of the substrate as a result of a sequence of lithographic processing steps. It is of course desired that the successive layers formed in the substrate are correctly in register with each other. Thus, great care is taken to ensure that the position of the substrate relative to the beam projection system is accurately known.

Various techniques are used to determine the position of a substrate relative to the beam projection system. These generally rely upon the substrate having formed upon it alignment marks that are arranged around the periphery of areas of the substrate onto which active circuit components or the like are to be formed. These marks are located to provide reference points relative to which the position of target portions on the substrate are determined. The alignment marks can be detected optically using the beam projection system, which is also used to project patterns onto the substrate. Such a "through the lens" or TTL approach to the problem of locating alignment marks allows for the position measurement location to be the same as the image formation location. Thus, "Abbe" errors are minimized. In other systems, the alignment mark detectors and the main beam projection system have different optical axes, in which case some means can be provided for compensating for relative movement of these axes.

In an example of a scanning-based system, as the frame supporting the beam projection system and the alignment mark detectors is scanned across the surface of a substrate by moving the substrate, the position of the substrate in the direction perpendicular to the scan direction and the scan speed is adjusted in dependence upon the measured positions of the alignment marks. Alternatively, or additionally, the digital image to be projected can be adjusted. In the case where the patterning means comprises an array of individually controllable elements, this can involve translating or otherwise adjusting the digital pattern applied to the array. The height of the substrate can also be controlled using some type of level sensor arrangement.

Typically, a lithographic apparatus of a given production facility is designed (or configured in a relatively inflexible way) for use with substrates of a fixed size. In the case of flat panel displays or color filter plates, the substrate dimensions can be of the order of several meters, with multiple panels being formed on each substrate. The alignment marks are provided around the periphery of the substrate, as well as between panels. However, there is a desire to introduce flexibility in the layout of panels on the substrates, such that a given production facility can be used to produce panels with different dimensions. This has meant that, for non-standard panel layouts, either only alignment marks around the periphery of the substrate can be used (as the periphery is the only "blank" region common to all substrate layouts), or some manual realignment of the detectors must be carried out While a continuous array of alignment mark detectors positioned across the substrate to detect alignment marks in various intermediate positions can be desirable, this is not practical due to the very high resolution required and the number of detectors that that would necessitate.

A number of factors, for example thermal effects, can cause local variations in the shape of a substrate. It is therefore desirable to provide alignment marks at relatively small intervals across the surface of the substrate. However, the approach described in the previous paragraph mitigates against this as the entire central area of the substrate is effectively unusable for the placement of alignment marks.

Therefore, what is needed is a lithographic apparatus and method that allow for the flexible positioning of alignment marks within the central area of a substrate to be patterned.

SUMMARY OF THE INVENTION

According to a first aspect of the present invention there is provided a lithographic apparatus comprising a substrate table, a frame, one or more projection systems, one or more alignment mark detectors, and a position sensor. The substrate table supports a substrate having alignment marks provided on a surface thereof. The frame is moveable relative to the substrate. The one or more projection systems projecting a patterned beam onto a target portion of the substrate. Each projection system is attached to the frame. The one or more alignment mark detectors are attached to the frame and moveable with respect to the frame. The position sensor is associated with each alignment mark detector, and determine the position of the detector relative to the frame or projection system(s).

In this embodiment, the invention makes it possible to use a single lithographic apparatus, in a stable operating configuration, for the production of panels or other devices having variable dimensions. Alignment mark detectors can be moved relative to the frame supporting the detectors and the projection system(s) in order to accommodate substrates having alignment marks placed at differing locations within their central areas. It is no longer necessary to rely upon only peripheral alignment marks to align the projection system(s) to the substrate. Improved production accuracy and flexibility can therefore be achieved.

It will be appreciated that the frame can be moveable relative to the substrate by moving the frame, the substrate, or both.

In one example, the frame can be moveable relative to the substrate along a first linear movement axis, the "scan direction," parallel to the plane of the substrate. Each alignment mark detector is then movable relative to the frame along a second linear axis, substantially perpendicular to the first axis, again in a plane parallel to the plane of the substrate.

In one example, each alignment mark detector can have a range of movement sufficient to provide coverage of substantially the whole dimension of the substrate in the direction of the second axis. In the case of multiple detectors, the movement of the detectors is non-overlapping. Each detector is arranged to provide an output signal indicative of the positions of detected alignment marks.

In one example, each alignment mark detector can comprise an illumination system for supplying an alignment beam of radiation, a projection system for projecting the alignment beam onto a target portion of the substrate, and a sensor for detecting radiation reflected from the substrate.

In one example, each position sensor can comprise a laser interferometer. In one example, the laser interferometer comprises a reflector or mirror surface fixed relative to the associated alignment mark detector, and a laser and a radiation detector fixed relative to the frame. Alternatively, a linear grating system can be used.

In one example, the lithographic apparatus can comprise a linear motor associated with each alignment mark detector, which provides linear movement of the detector relative to the frame, and control means coupled to each linear motor for controlling the position of the motor(s) in dependence upon operator inputs.

In one example, the lithographic apparatus can comprise an alignment controller for receiving an output of the or each position sensor and of the or each alignment mark detector. In dependence upon the received signals, the controller is arranged to adjust the position of the substrate relative to the frame and/or the scanning speed of the substrate and/or the patterned beam generated by the or each projection system.

According to a further aspect of the invention there is provided a method of aligning a substrate with one or more projection systems of a lithographic apparatus. Each projection systems being fixed to a frame that is moveable relative to the substrate. The method comprises the following steps. Determining the approximate positions of alignment marks provided on a surface of the substrate. Moving one or more alignment mark detectors, relative to the frame or to the projection system(s), to positions at which the alignment marks can be detected.

In one example, the step of moving the one or more alignment mark detectors comprises monitoring the output of one or more detector position sensors to provide detector position feedback, the position sensor(s) being fixed to the frame and/or the alignment mark detector(s).

In one example, the step of moving one or more alignment mark detectors comprises applying drive signals to a linear drive mechanism associated with each alignment mark detector. Each linear drive mechanism can comprise a linear motor.

In various examples, the present invention is applicable to lithographic apparatus relying upon either a mask or arrays of individually controllable elements to impart a pattern to the projected beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 8 illustrates in a plan view substrates with various panel layouts, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Figure 1:
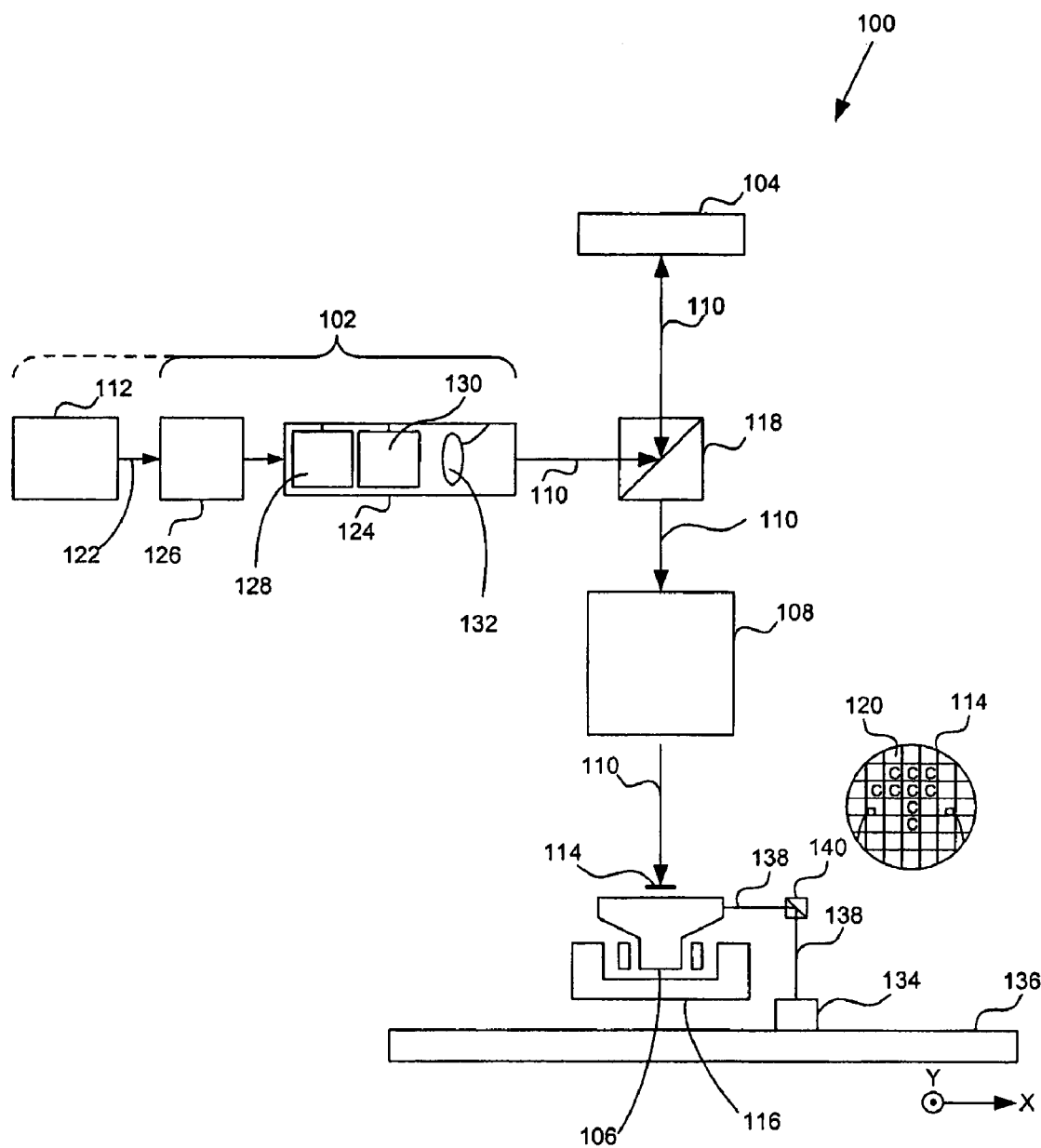
FIG. 1 depicts a lithographic apparatus, according to one embodiment of the present invention.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplar Scanning and Detection Systems

Figure 2:
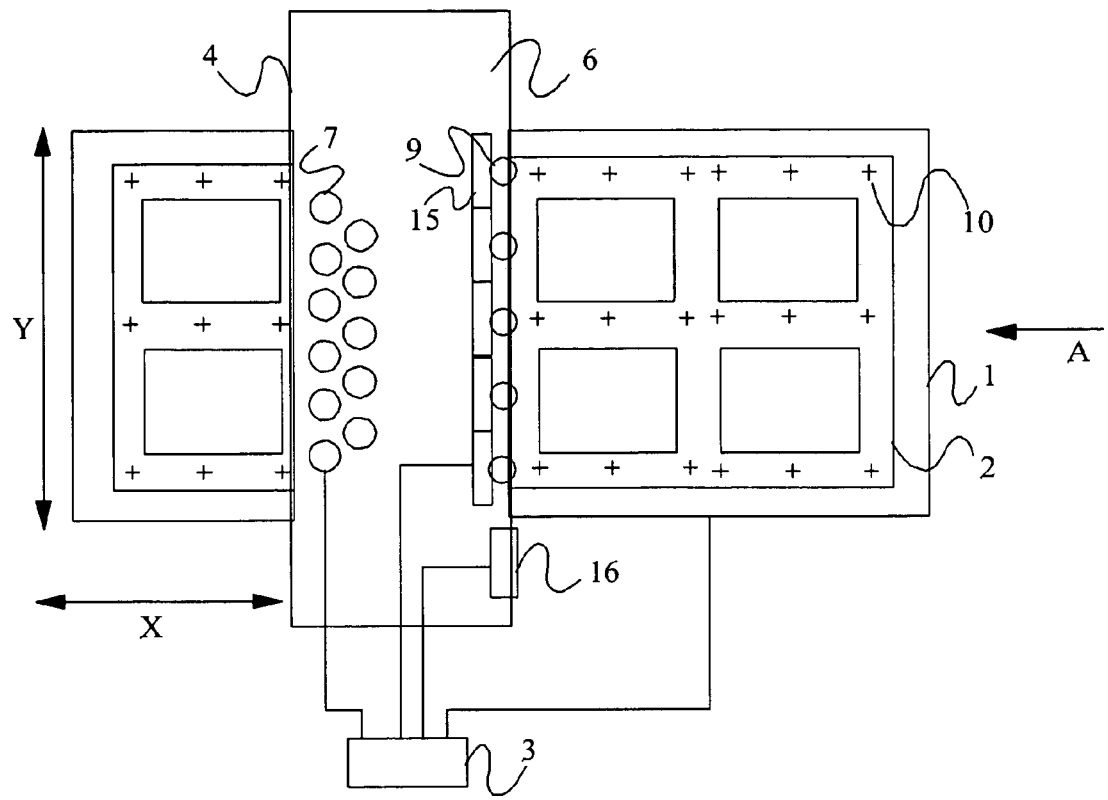
FIG. 2 illustrates in plan view a scanning lithographic apparatus, according to one embodiment of the present invention.
Figure 3:
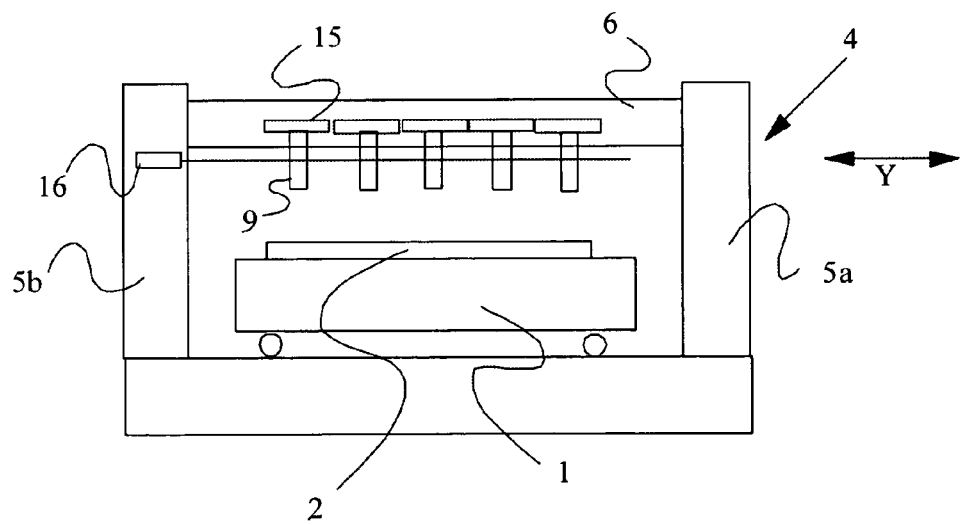
FIG. 3 illustrates in side elevation view the apparatus of FIG. 2 viewed in the direction of Arrow A.

FIG. 2 illustrates in plan view a scanning lithographic apparatus, according to one embodiment of the present invention. FIG. 3 illustrates in side elevation view the apparatus of FIG. 2 viewed in the direction of Arrow A. These are directed to a scanning-based mode of operation.

In FIG. 2, the lithographic apparatus is arranged to scan a two-dimensional pattern in one direction, the "x" direction, across the surface of a substrate 2. The apparatus comprises a substrate table 1 on which is mounted substrate 2. Substrate table 1 is moveable in the scanning direction, i.e., the x direction, as well as in the y (and z) directions, by a drive device (not shown in FIG. 2), which operates under the control of a control system 3.

Mounted above substrate 2 and substrate table 1 is a trolley frame 4 that is fixed relative to substrate table 1. As illustrated in FIG. 3, frame 4 includes support legs 5a,5b and a gantry 6. Gantry 6 is supported on support legs 5a,5b and crosses the space over substrate table 1. Gantry 6 supports a set of projection systems 7 (eleven such systems are illustrated in FIG. 2), each as described above with reference to FIG. 1. As frame 4 is scanned over substrate 2, projection systems 7 are positioned towards the trailing edge of gantry 6 and are arranged so that the generated patterned beams combined to provide complete coverage of substrate 2 in the y direction.

In one example, each projection system 7 can be individually controlled to alter the position at which patterned light impinges on substrate 2, as well as to alter the shape of the beam. As mentioned above, this is generally achieved by shifting the digital pattern applied to array of individually controllable elements forming patterning means 104. The digital signals applied to the projection systems 7 are generated by control system 3.

A set of alignment mark detectors 9 are located towards the leading edge of gantry 6. It is to be appreciated that, although FIGS. 2 and 3 illustrate five such detectors, this number can vary. Each detector 9 is arranged to detect the position of alignments marks 10 on the surface of substrate 2. Also, each detected 9 detects which alignment marks 10 pass through the field-of-view of detectors 9, relative to the position of trolley frame 4, allowing for the determination of the position of projection systems 7.

Figure 4:
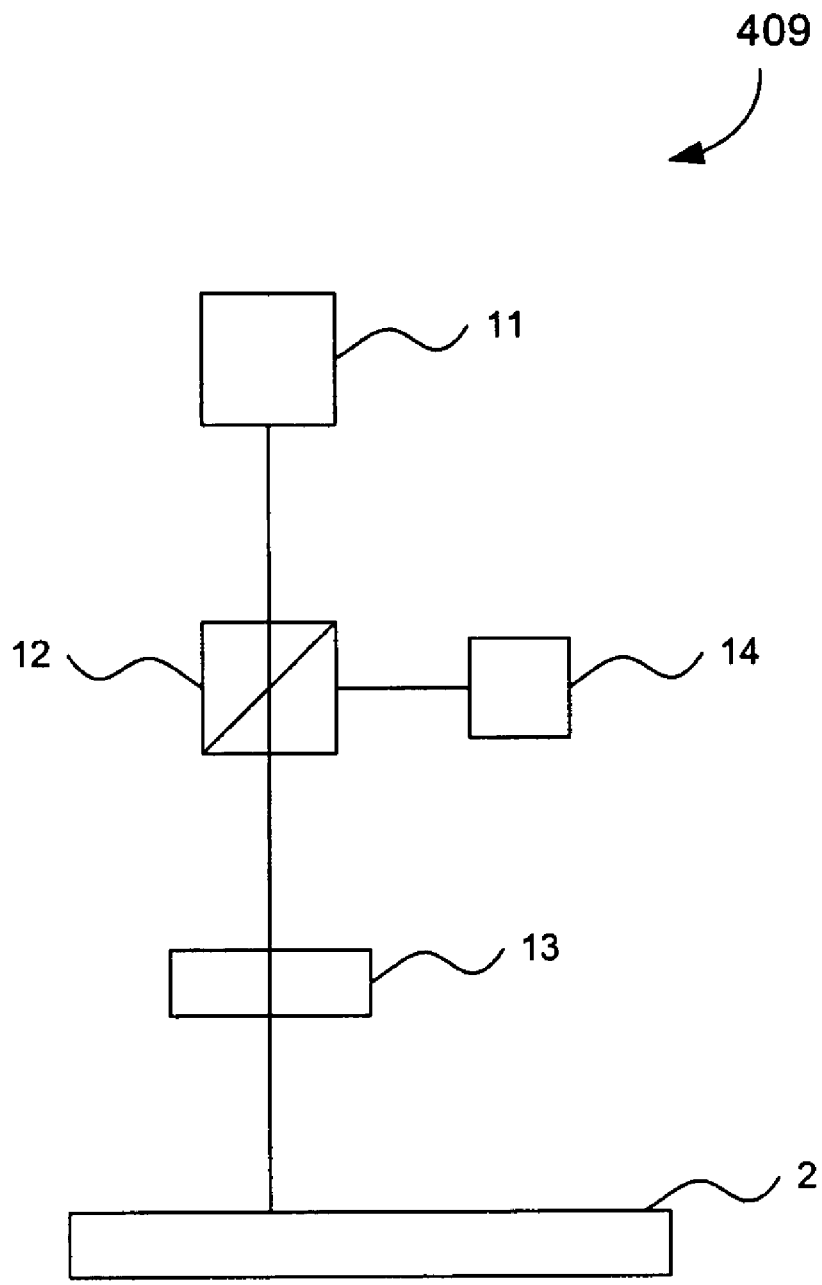
FIG. 4 illustrates schematically an alignment mark, according to one embodiment of the present invention.

FIG. 4 illustrates schematically an alignment mark detector 409, according to one embodiment of the present invention. Detector 409 is one example arrangement for detector 9. Each alignment mark detector 409 comprises a radiation source 11 that operates at a wavelength that will not cause exposure of a photoresist on a surface of substrate 2. For example, source 11 can produce red light that is shifted with respect to the light that provides the exposing beams (e.g., 350 to 450 nm) used by projection systems 7. The radiation is projected onto the surface of substrate 2, via a beam splitter 12, using projecting optics 13. A radiation sensor 14 is provided to detect light reflected from the surface of substrate 2. Typically, alignment marks 10 (not shown in FIG. 4) are provided by exposed and developed regions of the photoresist on the substrate 2, and will cause a high level of reflection to occur. Sensor 14 detects the alignment mark 10 by looking for a change from a low level of reflection to a high level of reflection, and back to a low level. Sensor 14 provides an output signal to control system 3 (i.e., the control system being arranged to determine the position of the detected alignment mark 10 with respect to trolley frame 4) and any deviation of that position from the expected position.

It is to be appreciated that other detector arrangements can be used, including those which share components, e.g., the radiation source, between detectors 9.

With reference again to FIG. 3, in this example each alignment mark detector 9 is mounted on a linear drive mechanism 15, which comprises a linear motor. Drive mechanism 15 is able to drive detector 9 across gantry 6 in the y direction, across some range of movement. Typically, this allows each detector 9 to move halfway across the space between each of the detectors 9, such that in combination detectors 9 give full coverage across substrate 2 in the y direction.

Each drive mechanism 15 is coupled to control system 3 that controls the position of detector 9. In this example, control system 3 receives detector position information from a set of laser interferometry systems 16. Interferometry systems 16 comprises, for each alignment mark detector 9, a mirror fixed to detector 9, and a laser and sensor arrangement fixed to frame 4. Control system 3 monitors the outputs of the respective sensors as detectors 9 are moved in order to count interference fringes and determine the positions of detectors 9. In the interests of clarity, only a single interferometry system 16 is illustrated in FIGS. 2 and 3, although it will be appreciated that one such system can be provided for each detector 9.

In another example, control system 3 receives position information from operator inputs.

Exemplary Substrates

Figure 5:
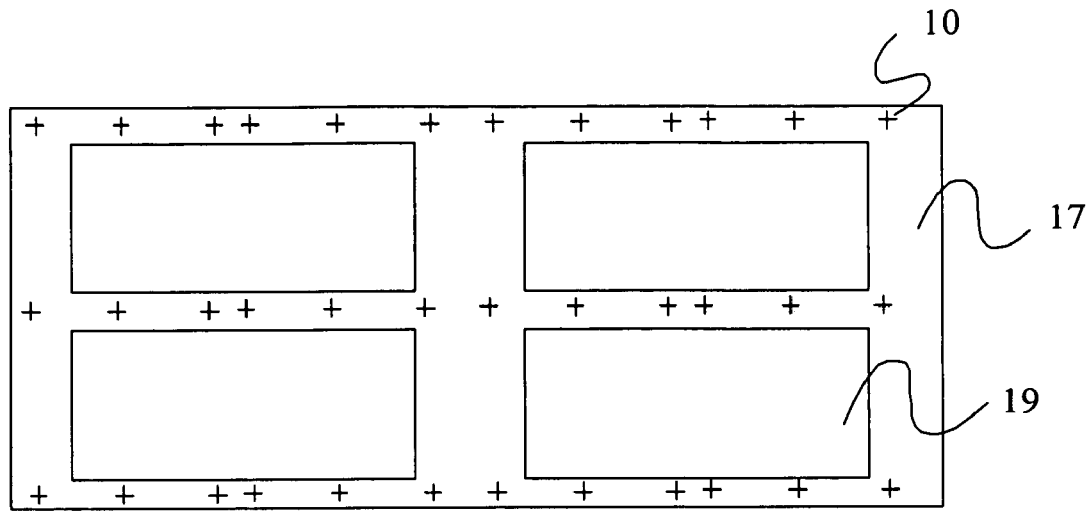
FIGS. 5 and 6 illustrate in plan view substrates with various panel layouts, according to various embodiments of the present invention.
Figure 6:
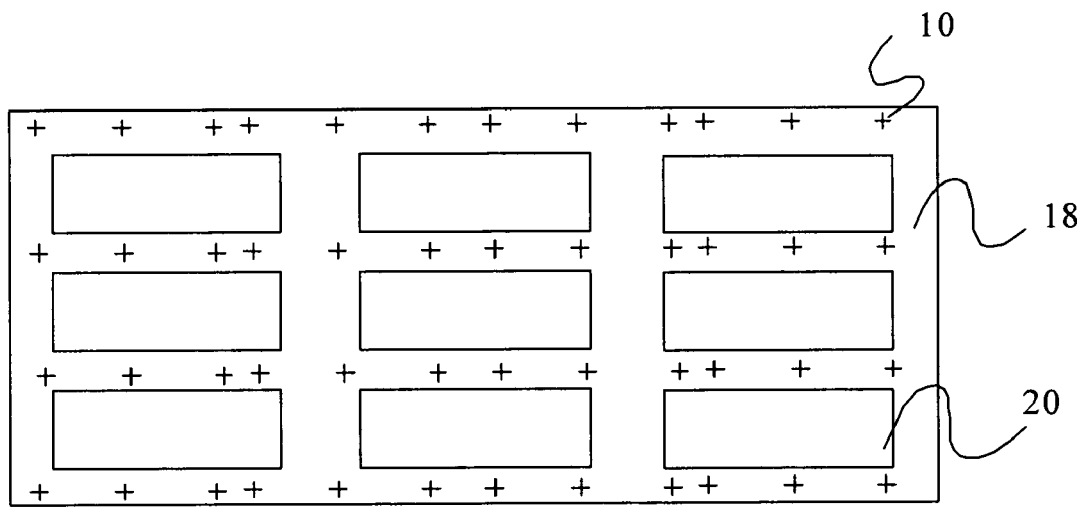

FIGS. 5 and 6 illustrate in plan view substrates 17 and 18, respectively, with various panel layouts, according to various embodiments of the present invention. Substrates 17,18 have the same overall dimensions, but are designed to accommodate different flat panel display sizes. Substrate 17 of FIG. 5 is designed to accommodate four panels 19 of equal size, while substrate 18 of FIG. 6 is designed to accommodate nine panels 20 of equal size. Alignment marks 10 on each panel are arranged to suit the panel layouts and to maximize the accuracy with which substrates 17, 18 can be aligned during exposure.

FIG. 8 illustrates in plan view a substrate 21' with panels having various sizes A, B and C, which in the example shown are not equal to each other.

Exemplary Operation

With reference to FIGS. 2, 3, and 5, in preparation for exposure substrate 17 is loaded onto substrate table 1. This process can usually be done with an accuracy of a few millimeters. In one example, an operator programs into control system 3 characteristics of substrate 17, e.g., a number of rows of alignment marks 10 and the positions of the rows (in the y direction). In another example, the operator enters a substrate type code, where the alignment mark data for each substrate type having been pre-programmed into control system 3. In either example, this operation causes an appropriate number of alignment mark detectors 9 to be activated, in this case three, and moved by means of the respective linear drive mechanisms 15 to appropriate positions above the rows of alignment marks 10. In one example, fields-of-view of detectors 9 are sufficient to accommodate positioning errors of substrate 17 on substrate table 1 to within a few millimeters or so. Alternatively, some scanning procedure could be carried out to center each detector 9 above the corresponding alignment mark row.

In this example, during positioning of detectors 9, their positions can be accurately recorded using laser interferometry system 16. Final position information is fed to control system 3. Typically, control system 3 uses this information prior to scanning to shift substrate table 1 in the y direction to correctly align the projection systems with the substrate. The fields-of-view of detectors 9 are sufficient to accommodate this slight shift of substrate 17. Exposure then commences, with substrate 17 being scanned under trolley frame 4 in the x-direction. As each detector 9 detects the passage of an alignment mark 10, position information is fed to control system 3. As already described, control system 3 acts on the received alignment mark position data to correctly align projection systems 7 and substrate 17 by adjusting the projection systems' optics, adjusting the digital pattern applied to the array of individually controllable elements, adjusting the substrate table position, or any combination of these adjustments.

With reference again to FIGS. 2, 3, and 6, the data input by the operator causes four of detectors 9 on gantry 6 to be activated and moved into position. The use of four rows of alignment marks 10 on substrate 18 is facilitated by the arrangement and number of panels 20, and generally increases the alignment accuracy during the exposure procedure.

Figure 7:
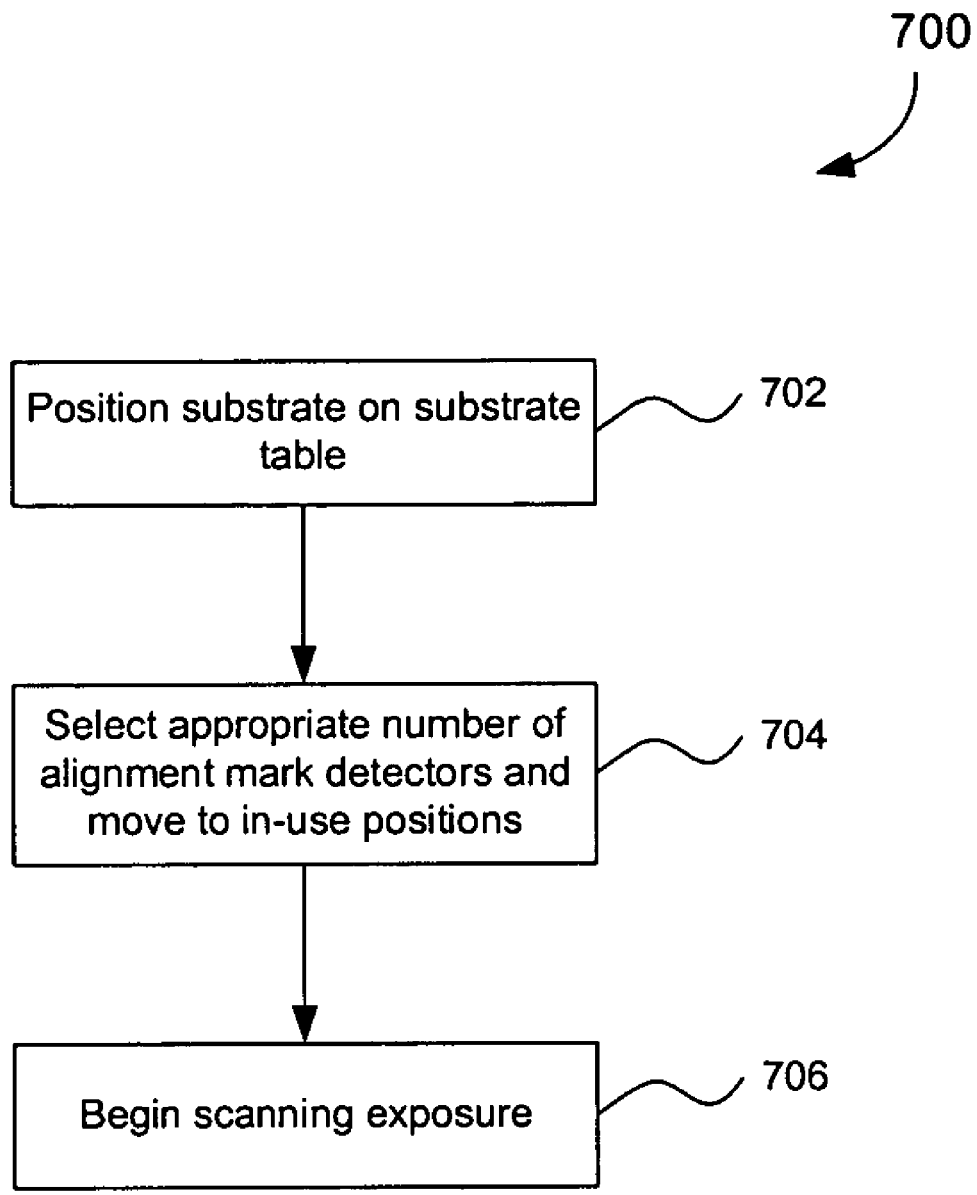
FIG. 7 is a flow diagram illustrating a method of operation, according to one embodiment of the present invention.

FIG. 7 is a flow diagram illustrating a method 700 of operation, according to one embodiment of the present invention. In step 702, a substrate is positioned on a substrate table. In step 704, an appropriate number of align mark detectors are selected and moved to in-use positions. In step 706, scanning exposure is performed.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that produces a beam of radiation;
   a pattern generating device that patterns the beam;
   a substrate table that supports a substrate, the substrate having alignment marks provided on a surface thereof relative to a plurality of panels having variable or different dimensions, the plurality of panels being supported on the substrate;
   a frame moveable relative to the substrate;
   a plurality of projection systems coupled to the frame, wherein the plurality of projection systems are capable of projecting respective portions or copies of the patterned beam onto a target portion of respective ones of the plurality of panels having variable or different dimensions on the substrate;
   one or more alignment mark detectors coupled to the frame and moveable with respect to the frame, wherein the detectors detect alignment marks by analyzing reflection patterns; and
   a position sensor associated with each of the one or more alignment mark detectors, wherein the position sensor determines the position of the one or more alignment mark detectors relative to at least one of the frame and the plurality of projection systems.

2. The apparatus of claim 1, wherein:
   the frame is moveable relative to the substrate along a first axis in a plane substantially parallel to a plane of the substrate; and
   the one or more alignment mark detectors are movable relative to the frame along a second axis substantially perpendicular to the first axis and in a plane parallel to the plane of the substrate.

3. The apparatus of claim 2, wherein the one or more alignment mark detectors have a range of movement sufficient to provide coverage of substantially a whole dimension of the substrate in the direction of the second axis.

4. The apparatus of claim 1, wherein the one or more alignment mark detectors comprise:
   an illumination system that supplies an alignment beam of radiation;
   a projection system that projects the alignment beam onto an alignment target portion of the substrate; and
   a sensor that detects radiation reflected from the substrate.

5. The apparatus of claim 1, wherein each of the position sensors comprise:
   a laser interferometer.

6. The apparatus of claim 5, wherein the laser interferometer comprises:
   a reflector or mirror surface fixed relative to the associated alignment mark detector; and
   a laser and a radiation detector fixed relative to the frame.

7. The apparatus of claim 1, wherein each of the position sensors comprise:
   a linear grating system.

8. The apparatus of claim 1, further comprising
   a linear motor associated with each of the one or more alignment mark detectors that provides linear movement of a respective one of the alignment mark detectors relative to the frame.

9. The apparatus of claim 1, further comprising:
   a controller that controls position of the one or more alignment mark detectors during an exposure period based on at least one of operator inputs and feedback from respective ones of the position sensors, wherein respective position of each of the position sensors moves to correspond in position to the variable or different dimensions of the panels while the substrate is moving along a scanning direction during the exposure period.

10. The apparatus of claim 1, further comprising:
    an alignment controller that receives an output from the one or more alignment mark detectors and, based on the received signals, adjusts at least one of (i) the position of the substrate relative to the frame, (ii) a scanning speed of the substrate, and (iii) the patterned beam generated by each of the plurality of projection systems.

11. The apparatus of claim 1, wherein at least five of the one or more alignment mark detectors and respective position sensors are used.

12. A method, comprising:
    during an exposure period determining approximate positions of alignment marks provided proximate to respective ones of a plurality of panels having variable or different dimensions, each of the variable or different dimensioned panels being positioned on a surface of a substrate; and
    moving one or more alignment mark detectors relative to a frame that is moveable relative to the substrate, wherein the one or more alignment mark detectors are moved to be aligned with respective one or more alignment marks, such that the one or more alignment mark detectors are positioned to correspond to the variable or different dimensioned of panels;

determining positions of the one or more alignment mark detectors; and aligning a plurality of projection systems, capable of projecting respective portions or copies of a patterned beam onto a target portion, with respect to respective ones of the plurality of variable or different dimensioned panels on the substrate using the determined positions of the one or more alignment mark detectors.

13. The method of claim 12, wherein the step of moving one or more alignment mark detectors comprises:

monitoring an output of one or more detector position sensors to provide detector position feedback, the one or more position sensors being fixed to at least one of the frame and the alignment mark detectors.

14. The method of claim 12, wherein the step of moving one or more alignment mark detectors comprises:

applying drive signals to a linear drive mechanism associated with each of the one or more alignment mark detectors.

15. The method of claim 14, wherein each of the one or more linear drive mechanisms utilize a linear motor.

16. The apparatus of claim 1, wherein the frame comprises:

a base portion;

first and second leg portions coupled to opposite sides of the base portion, such that the substrate passes between the first and second leg portions; and a gantry portion, the gantry portion supporting the plurality of projection systems and the one or more alignment mark detectors.

17. A lithographic apparatus, comprising:

an illumination system that produces a beam of radiation;

a pattern generating device that patterns the beam;

a substrate table that supports a substrate, the substrate having alignment marks provided on a surface thereof relative to a plurality of panels;

a frame moveable relative to the substrate;

a plurality of projection systems coupled to the frame, wherein the plurality of projection systems are capable of projecting respective portions or copies of the patterned beam onto a target portion of respective ones of the plurality of panels on the substrate;

one or more alignment mark detectors coupled to the frame and moveable with respect to the frame, wherein the detectors detect alignment marks by analyzing reflection patterns;

a position sensor associated with each of the one or more alignment mark detectors, wherein the position sensor determines the position of the one or more alignment mark detectors relative to at least one of the frame and the plurality of projection systems; and a controller that controls position of the one or more alignment mark detectors during an exposure period based on at least one of operator inputs and feedback from respective ones of the position sensors, wherein respective position of each of the position sensors moves to correspond in position to the various sizes of the panels while the substrate is moving along a scanning direction during the exposure period.

* * * * *

UNITED STATES PATENT AND TRADEMARK OFFICE
CERTIFICATE OF CORRECTION

PATENT NO.       : 7,388,663 B2                                    Page 1 of 1
APPLICATION NO.  : 10/975183
DATED            : June 17, 2008
INVENTOR(S)      : Cheng-Qun Gui It is certified that error appears in the above-identified patent and that said Letters Patent is hereby corrected as shown below:

<u>Column 13</u>
Line 5 please replace "dimensioned of panels" with --dimensioned panels--.

Signed and Sealed this

Twenty-sixth Day of August, 2008

JON W. DUDAS
*Director of the United States Patent and Trademark Office*